(12) United States Patent
Etoh (10) Patent No.: US 7,453,104 B2
(45) Date of Patent: Nov. 18, 2008

(54) OPERATIONAL AMPLIFIER INCLUDING LOW DC GAIN WIDEBAND FEED FORWARD CIRCUIT AND HIGH DC GAIN NARROWBAND GAIN CIRCUIT

(75) Inventor: Toshiyuki Etoh, Kanagawa (JP)

(73) Assignee: NEC Electronics Corporation, Kawasaki-shi, Kanagawa (JP)

( * ) Notice: Subject to any disclaimer, the term of this patent is extended or adjusted under 35 U.S.C. 154(b) by 380 days.

(21) Appl. No.: 11/038,097

(22) Filed: Jan. 21, 2005

(65) Prior Publication Data

US 2005/0162198 A1 Jul. 28, 2005

(30) Foreign Application Priority Data

Jan. 23, 2004 (JP) ............................. 2004-015648

(51) Int. Cl.
*H01L 29/74* (2006.01)
(52) U.S. Cl. ..................... 257/159; 257/115; 257/123; 257/157; 257/158; 257/160; 327/52; 327/89; 327/246; 327/247; 327/280; 327/287; 327/359; 327/563
(58) Field of Classification Search ................. 257/115, 257/123–124, 157–159, 160, 133, E21.632; 327/530, 540, 52, 89, 246–247, 280, 287, 327/359, 563
See application file for complete search history.

(56) References Cited

U.S. PATENT DOCUMENTS 6,201,434 B1 * 3/2001 Kanda et al. ................ 327/538

(Continued)

OTHER PUBLICATIONS

Thomas Byunghak Cho, et al., "A 10 b, 20 Msample/s, 35 mW Pipeline A/D Converter", IEEE Journal of Solid-State Circuits, vol. 30, No. 3, pp. 166-172, Mar. 1995.

(Continued)

*Primary Examiner*—Phuc T Dang
*Assistant Examiner*—Thanh Y Tran
(74) *Attorney, Agent, or Firm*—McGinn IP Law Group, PLLC (57) ABSTRACT

In an operational amplifier including first and second power supply terminals, first and second input terminals, and a first and second output terminals, a first differential amplifier circuit includes first and second MOS transistors with a common source connected to a first tail current source, first and second load resistors and a first non-doped MOS transistor connected between the first and second resistors and the second power supply terminal. A second differential amplifier circuit includes third and fourth MOS transistors with a common source connected to a second tail current source, third and fourth load resistors and a second non-doped MOS transistor connected between the third and fourth load resistors and the second power supply terminal. A first output circuit includes a fifth MOS transistor with a gate connected to the drain of the second MOS transistor, and a sixth MOS transistor with a gate and a drain connected to the drain of the fifth MOS transistor, and a second output circuit includes a seventh MOS transistor with a gate connected to the drain of the first MOS transistor, and an eighth MOS transistor with a gate and a drain connected to the drain of the seventh MOS transistor. A first intermediate circuit is connected between the drain of the third MOS transistor and the gate of the sixth MOS transistor, and a second intermediate circuit is connected between the drain of the fourth MOS transistor and the gate of the eighth MOS transistor.

10 Claims, 5 Drawing Sheets

U.S. PATENT DOCUMENTS

| | | | |
|---|---|---|---|
| 6,329,784 B1 * | 12/2001 | Puppin et al. | 318/778 |
| 6,605,982 B2 * | 8/2003 | Callahan, Jr. | 327/535 |
| 2003/0071673 A1 * | 4/2003 | Jordanger et al. | 327/333 |
| 2004/0196096 A1 * | 10/2004 | Kondo et al. | 327/540 |

OTHER PUBLICATIONS

Mikko Waltari, et al., "A 220-MSample/s CMOS Sample-and-Hold Circuit Using Double-Sampling", Analog Integrated Circuits and Signal Processing, vol. 18, pp. 21-31, 1999.

* cited by examiner

OPERATIONAL AMPLIFIER INCLUDING LOW DC GAIN WIDEBAND FEED FORWARD CIRCUIT AND HIGH DC GAIN NARROWBAND GAIN CIRCUIT

BACKGROUND OF THE INVENTION

1. Field of the Invention

The present invention relates to a high DC gain wideband operational amplifier operable at a low operating voltage.

2. Description of the Related Art

A prior art operational amplifier is constructed by an input circuit including a differential pair formed by N-channel MOS transistors associated with an N-channel MOS transistor serving as a tail current source and load N-channel MOS transistors, and output circuits connected to the input circuit, each of the output circuits including a drive cascode circuit and a load cascode circuit (see: T. B. Chuo et al., "A 10b, 20 Msample/s, 35 mW Pipeline A/D Converter", IEEE, Journal of Solid-State Circuits, Vol. 30, pp. 166-172, March 1995, and M. Waitari et al., "A 220-MSample/s CMOS Sample-and-Hold Circuit Using Double-Sampling", Analog Integrated Circuits and Signal Processing, 18, pp 21-31, 1999). This will be explained later in detail.

In the above-described prior art operational amplifier, however, the minimum operating voltage is relatively high so that the power consumption would be increased.

In order to decrease the minimum operating voltage, the load N-channel MOS transistors of the input circuit may be replaced by non-doped N-channel MOS transistors whose gate-to-source voltage is about 0.1 V; in this case, however, the gate-to-source capacitance of the non-doped N-channel MOS transistors is very large, which would remarkably degrade the bandwidth characteristics.

Also, in the above-described prior art operational amplifier, a high DC gain cannot be realized, since the input circuit adds a non-dominant pole to the transfer function, so that the gain of the input circuit must be kept low enough to ensure that this non-dominant pole lies at a sufficiently high frequency, so that the DC gain is subject to only the output circuits.

Note that, in order to increase the DC gain, triple cascode circuits may be used instead of the above-mentioned cascode circuits, in this case, however, the dynamic output range would be decreased. Also, in order to increase the DC gain, gain boost circuits can be connected to the above-mentioned cascode circuits; in this case, however, the integration would be degraded and the power consumption would be increased. Regarding "gain boost circuits", refer to FIG. 6 of T. B. Chuo et al., "A 10b, 20 Msample/s, 35 mW Pipeline A/D converter", IEEE Journal of Solid-State Circuits, Vol. 30, No. 3, pp. 166-172, March 1995.

SUMMARY OF THE INVENTION

It is an object of the present invention to provide a high DC gain wideband operational amplifier operable at a low operating voltage.

According to the present invention, in an operational amplifier including first and second power supply terminals, first and second input terminals, and first and second output terminals, a first differential amplifier circuit includes first and second MOS transistors with a common source connected to a first tail current source, first and second resistors and a first non-doped MOS transistor connected between the first and second load resistors and the second power supply terminal. A second differential amplifier circuit includes third and fourth MOS transistors with a common source connected to a second tail current source, and third and fourth load resistors and a second non-doped MOS transistor connected between the third and fourth load resistors and the second power supply terminal. A first output circuit includes a fifth MOS transistor with a gate connected to the drain of the second MOS transistor, and a sixth MOS transistor with a gate and a drain connected to the drain of the fifth MOS transistor, and a second output circuit includes a seventh MOS transistor with a gate connected to the drain of the first MOS transistor, and an eighth MOS transistor with a gate and a drain connected to the drain of the seventh MOS transistor. A first intermediate circuit is connected between the drain of the third MOS transistor and the gate of the sixth MOS transistor, and a second intermediate circuit is connected between the drain of the fourth MOS transistor and the gate of the eighth MOS transistor.

The first and second non-doped MOS transistors can be replaced by MOS transistors of the second conductivity type.

BRIEF DESCRIPTION OF THE DRAWINGS

The present invention will be more clearly understood from the description set forth below, as compared with the prior art, with reference to the accompanying drawings, wherein.

DESCRIPTION OF THE PREFERRED EMBODIMENTS

Before the description of the preferred embodiments, a prior art operational amplifier will be explained with reference to FIG. 1 (see: T. B. Chuo et al., "A 10b, 20 Msample/s, 35 mW Pipeline A/D Converter", IEEE, Journal of Solid-State Circuits, Vol. 30, pp. 166-172. March 1995, and M. Waitari et al., "A 220-MSample/s CMOS Sample-and-Hold Circuit Using Double-Sampling", Analog Integrated Circuits and Signal Processing, 18, pp. 21-31, 1999).

Figure 1:
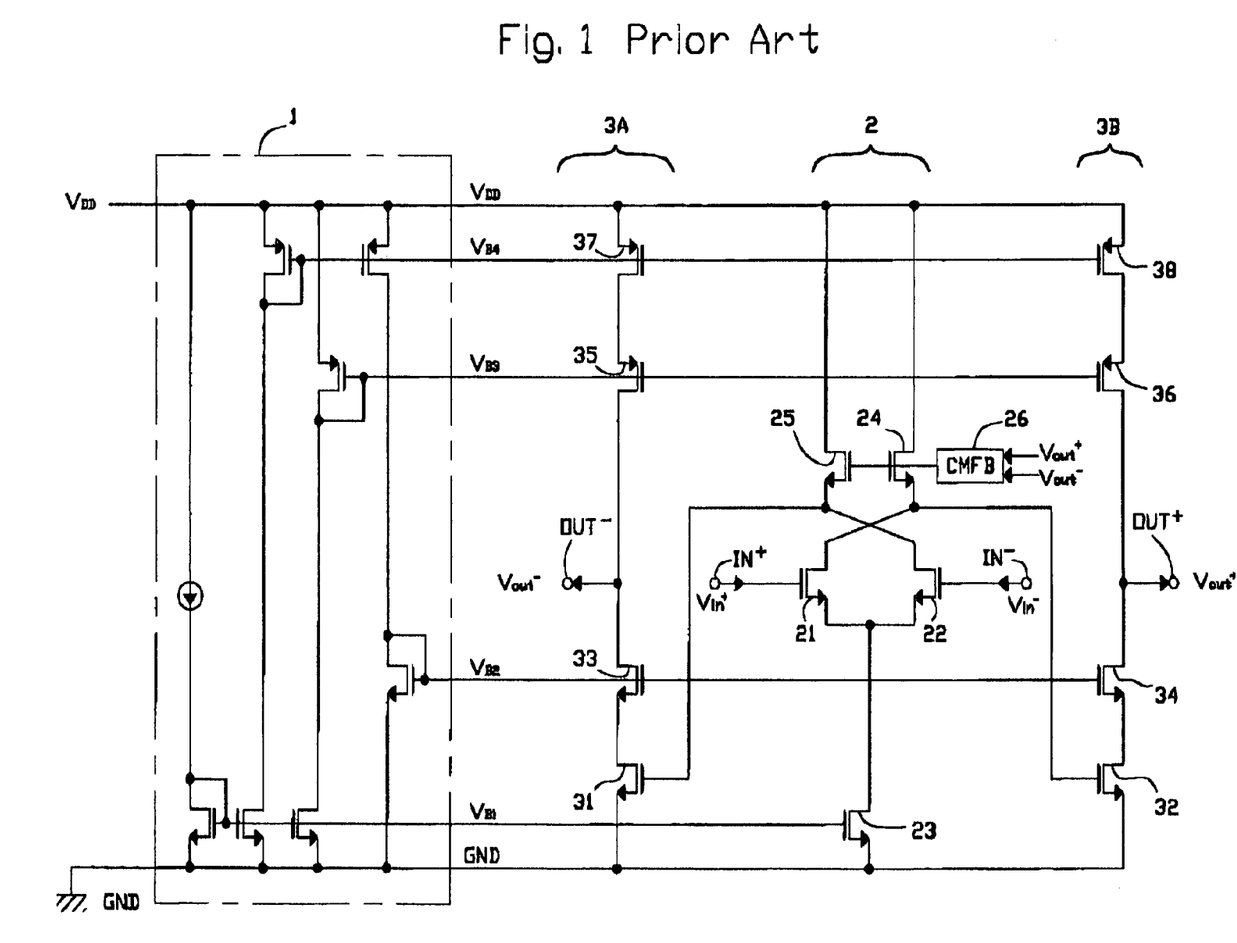
FIG. 1 is a circuit diagram illustrating a prior art operational amplifier.

In FIG. 1, a cascode operational amplifier receives differential input voltages $V_{in}^+$ and $V_{in}^-$ at input terminals IN$^+$ and IN$^-$, respectively, and generates differential output voltages $V_{out}^+$ and $V_{out}^-$ at output terminals OUT$^+$ and OUT$^-$, respectively.

A bias circuit 1 receives a ground voltage GND and a power supply voltage $V_{DD}$ to generate bias voltages $V_{B1}$, $V_{B2}$ and $V_{B3}$ where GND<$V_{B1}$, GND<$V_{B2}$ and $V_{B3}$<$V_{B4}$<$V_{DD}$.

An input circuit 2 is constructed by a differential pair formed by N-channel MOS transistors 21 and 22 associated with an N-channel MOS transistor 23 serving as a tail current source connected to the ground terminal (GND), and load N-channel MOS transistors 24 and 25. The N-channel MOS transistors 21 and 22 have a common source connected to the drain of the N-channel MOS transistor 23, gates adapted to receive the input voltages $V_{in}^+$ and $V_{in}^-$, respectively, and drains connected to the sources of the load N-channel MOS transistors 24 and 25, respectively, whose drains are connected to the power supply terminal ($V_{DD}$). Also, the gates of the N-channel MOS transistors 24 and 25 are controlled by a common mode feedback circuit 26, so that the common mode voltage or intermediate voltage between the differential output voltages $V_{out}^+$ and $V_{out}^-$ is brought close to a predetermined value such as $V_{DD}/2$.

An output circuit 3A is connected to the drain of the N-channel MOS transistor 22 to generate the output voltage $V_{out}^-$, and an output circuit 3B is connected to the drain of the N-channel MOS transistor 21 to generate the output voltage $V_{out}^+$.

The output circuit 3A (3B) is constructed by a drive cascode circuit formed by N-channel MOS transistors 31 and 33 (32 and 34) connected between the ground terminal (GND) and the output terminal OUT⁻ (OUT⁺), and a load cascode circuit formed by P-channel MOS transistors 35 and 37 (36 and 38) connected between the output terminal OUT⁻ (OUT⁺) and the power supply terminal ($V_{DD}$). In this case, a voltage at the drain of the N-channel MOS transistor 22 (21) is applied to the gate of the N-channel MOS transistor 31 (32), and the bias voltage $V_{B2}$ is applied to the gate of the N-channel MOS transistor 33 (34). Also, the bias voltage $V_{B3}$ is applied to the gate of the P-channel MOS transistor 35 (36), and the bias voltage $V_{B4}$ is applied to the gate of the P-channel MOS transistor 37 (38).

In the operational amplifier of FIG. 1 manufactured by a 0.5 μm CMOS process, the simulated DC gain was 62 dB and the simulated unity gain frequency was 450 MHz.

In the operational amplifier of FIG. 1, however, the minimum operating voltage is so large that the power consumption would be increased. That is, in the input circuit 2, the minimum operating voltage is determined by a gate-to-source voltage such as 0.65 V of each of the transistors 31 and 25 (32 and 24) plus a saturation voltage such as 0.25 V of one transistor the common mode feedback circuit 26 requires, i.e., about 1.55 Vtyp (=0.65×2+0.25). On the other hand, in the output circuit 3A (3B), the minimum operating voltage is determined by a saturation voltage such as 0.25V of each of the transistors 31 (32), 33 (34), 35 (36) and 37 (38) plus a peak-to-peak voltage swing such as 0.5 $V_{p-p}$ of the output voltage $V_{out}^+$ and $V_{out}^-$ i.e., about 1.5 Vtyp (=0.25×4+0.5). Finally, the minimum operating voltage is determined by about 1.55 V of the input circuit 2, and in this case, the nominal operating voltage will be 1.8 V in view of temperature characteristics and fluctuation, which would increase the power consumption.

Figure 2:
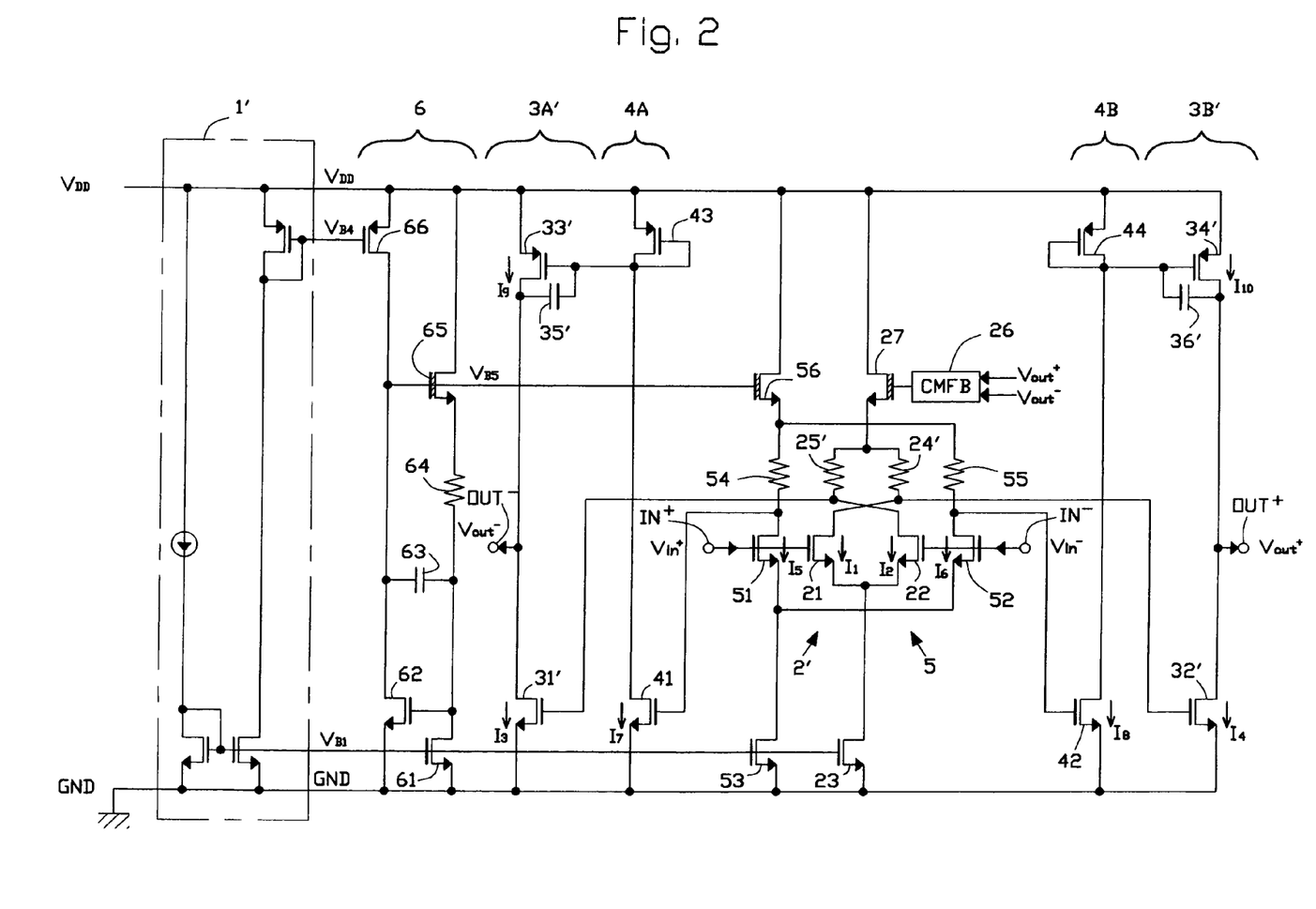
FIG. 2 is a circuit diagram illustrating a first embodiment of the operational amplifier according to the present invention.

In FIG. 2, which illustrates a first embodiment of the operational amplifier according to the present invention, the bias circuit 1, the input circuit 2, and the output circuits 3A and 3B of FIG. 1 are modified to a bias circuit 1', an input circuit 2'and output circuits 3A' and 3B', respectively. Also, inverter circuits 4A and 4B, another input circuit 5 and another bias circuit 6 are added.

The bias circuit 1' receives the ground voltage GND and the power supply voltage $V_{DD}$ to generate only the bias voltage $V_{B1}$ and $V_{B4}$.

The input circuit 2' is constructed by load resistors 24' and 25', and a non-doped N-channel MOS transistor 27 with a threshold voltage of about 0.1 V serving as a source follower instead of the load N-channel MOS transistors 24 and 25 of the input circuit 2 of FIG. 1.

On the other hand, the input circuit 5 is constructed by a differential pair formed by N-channel MOS transistors 51 and 52 associated with an N-channel MOS transistor 53 serving as a tail current source connected to the ground terminal (GND), load resistors 54 and 55, and a non-doped N-channel MOS transistor 56 with a threshold voltage of about 0.1 V serving as a source follower connected to the power supply terminal ($V_{DD}$).

The gate of the non-doped N-channel MOS transistor 27 is connected to the common mode feedback circuit 26, while the gate of the non-doped N-channel MOS transistor 56 is connected to the bias circuit 6.

In the input circuits 2' and 5, the DC gains are made low, and also, the resistance values of the load resistors 24', 25', 54 and 55 are so small that their DC voltage drop is small such as about 0.1 V. Thus, the minimum operating voltage $V_{DD}$ can be decreased. In this case, if the power supply voltage $V_{DD}$ is supplied directly to the load resistors 24', 25', 54 and 55, currents flowing through the output circuits 3A' and 3B' are affected directly by the power supply voltage $V_{DD}$.

Also, the non-doped N-channel MOS transistors 27 and 56 have a long channel length and large gate-to-source capacitances; in this case, however, only a common mode voltage component flows through the non-doped N-channel MOS transistors 27 and 56, so that the degradation of bandwidth for the amplified differential input voltages $V_{in}^+$ and $V_{in}^-$ would be suppressed.

The output circuit 3A' (3B') is of a push-pull type that is constructed by an N-channel MOS transistor 31' (32'), a P-channel MOS transistor 33' (34') and a phase compensation capacitor 35' (36').

The inverter circuit 4A (4B) is constructed by an N-channel MOS transistor 41 (42), and a diode-connected P-channel MOS transistor 43 (44).

The input circuit 2' is connected directly to the gate of the N-channel MOS transistors 31' and 32', but the input circuit 5 is connected via the inverter circuits 4A and 4B to the gates of the P-channel MOS transistors 33' and 34'. In more detail, the drain of the N-channel transistor 22 (21) is connected to the gate of the N-channel MOS transistor 31' (32'), and the drain of the N-channel MOS transistor 51 (52) is connected via the inverter circuit 4A (4B) to the gate of the P-channel MOS transistor 33' (34').

In order to stably operate the non-doped N-channel MOS transistor 56, the bias circuit 6 has a similar structure to those of the inverter circuits 4A and 4B and the input circuit 5. That is, the bias circuit 6 is constructed by an N-channel MOS transistor 61 corresponding to the N-channel MOS transistor 53, an N-channel MOS transistor 62 corresponding to the N-channel MOS transistors 41 and 42, a capacitor 63, a resistor 64 corresponding to the resistors 54 and 55, a non-doped N-channel MOS transistor 65 serving as a source follower corresponding to the non-doped N-channel MOS transistor 56, and a P-channel MOS transistor 66. In this case, the area ratio between the transistors of the bias circuit 6 and their corresponding transistors and the resistance ratio of the resistor 64 and the resistor 54 are determined to define a bias voltage $V_{B5}$, thus stabilizing the currents flowing through the output circuit 3A'(3B').

A low DC gain wideband feed forward circuit is realized by the input circuit 2' and the output circuits 3A' and 3B'. That is, the input voltage $V_{in}^+$ is amplified by the N-channel MOS transistor 21 to change a current $I_1$ flowing therethrough, i.e., the drain voltage thereof. Then, this drain voltage is amplified by the N-channel MOS transistor 32' to change a current $I_4$ flowing therethrough, i.e., the output voltage $V_{out}^+$. Thus, the input voltage $V_{in}^+$ is amplified by two transistors, i.e., the N-channel MOS transistors 21 and 32' in this low DC gain wideband feed forward circuit, so that the higher the input voltage $V_{in}^+$, the higher the output voltage $V_{out}^+$, while the lower the input voltage $V_{in}^+$, the lower the output voltage $V_{out}^+$. On the other hand, the input voltage $V_{in}^-$ is amplified by the N-channel MOS transistor 22 to change a current $I_2$ flowing therethrough, i.e., the drain voltage thereof. Then, this drain voltage is amplified by the N-channel MOS transistor 31' to change a current 13 flowing therethrough, i.e., the output voltage $V_{out}^-$. Thus, the input voltage $V_{in}^-$ is amplified by two transistors, i.e., the N-channel MOS transistors 22 and 31' in this low DC gain wideband feed forward circuit, so that the higher the input voltage $V_{in}^-$, the higher the output voltage $V_{out}^-$, while the lower the input voltage $V_{in}^-$, the lower the output voltage $V_{out}^-$.

A high DC gain narrowband circuit is realized by the input circuit 5, the inverters 4A and 4B and the output circuits 3A' and 3B'. That is, the input voltage $V_{in}^+$ is amplified by the N-channel MOS transistor 51 to change a current $I_5$ flowing therethrough, i.e., the drain voltage thereof. Then, this drain voltage is amplified by the N-channel MOS transistor 41 to change a current $I_7$ flowing therethrough, i.e., the drain voltage thereof. Finally, this drain voltage is amplified by the P-channel MOS transistor 33' to change a current $I_5$ flowing therethrough, i.e., the output voltage $V_{out}^-$. Thus, the input voltage $V_{in}^+$ is amplified by three transistors, i.e., the N-channel MOS transistors 51 and 41 and the P-channel MOS transistor 33' in this high DC gain narrowband circuit, so that the higher the input voltage $V_{in}^+$, the lower the output voltage $V_{out}^-$, while the lower the input voltage $V_{in}^+$, the higher the output voltage $V_{out}^-$. On the other hand, the input voltage $V_{in}^-$ is amplified by the N-channel MOS transistor 52 to change a current $I_6$ flowing therethrough, i.e., the drain voltage thereof. Then, this drain voltage is amplified by the N-channel MOS transistor 42 to change a current $I_8$ flowing therethrough, i.e., the drain voltage thereof. Finally, this drain voltage is amplified by the P-channel MOS transistor 34' to change a current $I_{10}$ flowing therethrough, i.e., the output voltage $V_{out}^+$. Thus, the input voltage $V_{in}^-$ is amplified by three transistors, i.e., the N-channel MOS transistors 52 and 42 and the P-channel MOS transistor 34' in this high DC gain narrowband circuit, so that the higher the input voltage $V_{in}^-$, the lower the output voltage $V_{out}^+$, while the lower the input voltage $V_{in}^-$, the higher the output voltage $V_{out}^+$.

In FIG. 2, the low DC gain wideband feed forward circuit is connected in parallel with the high DC gain narrowband circuit, so that the operational amplifier of FIG. 2 becomes a high DC gain wideband one.

Figure 3:
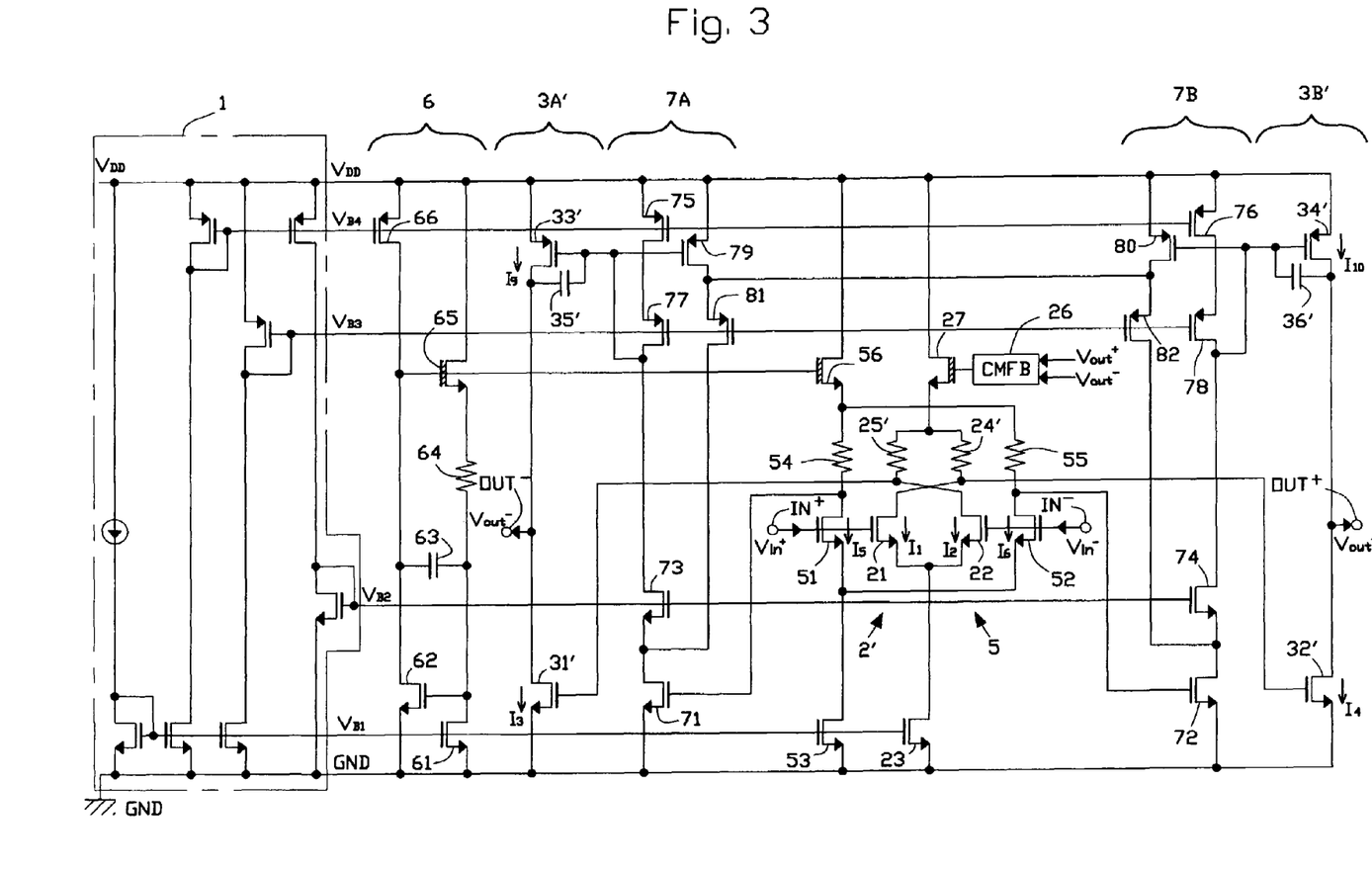
FIG. 3 is a circuit diagram illustrating a second embodiment of the operational amplifier according to the present invention.

In FIG. 3, which illustrates a second embodiment of the operational amplifier according to the present invention, the bias circuit 1' of FIG. 2 is replaced by the bias circuit 1 of FIG. 1, and the inverter circuits 4A and 4B of FIG. 2 are replaced by local negative feedback circuits 7A and 7B, respectively. That is, the local negative feedback circuits 7A and 7B are within the high DC gain narrowband circuit. The two local negative feedback circuits are connected to each other, so that bias currents flowing through the P-channel MOS transistors 33' and 34' would be stabilized even in a differential mode by the differential input voltages $V_{in}^+$ and $V_{in}^-$.

The local negative feedback circuit 7A (7B) is constructed by a cascode circuit formed by N-channel MOS transistors 71 and 73 (72 and 74), a cascode circuit formed by P-channel MOS transistors 75 and 77 (76 and 78), and a cascode circuit formed by P-channel MOS transistors 79 and 81 (80 and 82).

The N-channel MOS transistor 71 (72) has a source connected to the ground terminal (GND), a gate connected to the drain of the N-channel MOS transistor 51 (52), and a drain. Also, the N-channel MOS transistor 73 (74) has a source connected to the drain of the N-channel MOS transistor 71 (72), a gate adapted to receive the bias voltage $V_{B2}$, and a drain.

The P-channel MOS transistor 75 (76) has a source connected to the power supply terminal ($V_{DD}$), a gate adapted to receive the bias voltage $V_{B4}$, and a drain. Also, the P-channel MOS transistor 77 (78) has a source connected to the drain of the P-channel MOS transistor 75 (76), a gate adapted to receive the bias voltage $V_{B3}$, and a drain connected to the drain of the N-channel MOS transistor 73 (74) and the gate of the P-channel MOS transistor 33' (34').

The P-channel MOS transistor 79 (80) has a source connected to the power supply terminal ($V_{DD}$), a gate connected to the drain of the p-channel MOS transistor 77 (78) and the gate of the P-channel MOS transistor 33' (34'), and a drain. Also, the P-channel MOS transistor 81 (82) has a source connected to the drain of the P-channel MOS transistor 79 (80), a gate adapted to receive the bias voltage $V_{B3}$, and a drain connected to the drain of the N-channel MOS transistor 71 (72).

Further, a node between the drain of the P-channel MOS transistor 79 and the source of the P-channel MOS transistor 81 is connected to a node between the drain of the P-channel MOS transistor 80 and the source of the P-channel MOS transistor 82.

In FIG. 3, a low DC gain wideband feed forward circuit is realized in the same way as in FIG. 2. On the other hand, a high DC narrowband circuit is realized by the input circuits, the local negative feedback circuits 7A and 7B, and the output circuits 3A' and 3B'.

Further, in FIGS. 2 and 3, since the current of the N-channel MOS transistor 27 is controlled by the common mode feedback circuit 26, the common mode voltage or intermediate voltage between the differential output voltage $V_{out}^+$ and $V_{out}^-$ is brought close to a predetermined value such as $V_{DD}/2$.

In the input circuits 2' and 5 of FIGS. 2 and 3, the minimum operating voltage is determined by a gate-to-source voltage such as 0.1 V of the non-doped N-channel MOS transistor 27 (56), a bias voltage such as 0.25 V corresponding to a saturation voltage of one MOS transistor the common mode feedback circuit 26 of the bias circuit 6 requires, a voltage drop such as 0.1 V of the resistor 24' (25', 54, 55), and a gate-to-source voltage such as 0.65 V of the N-channel MOS transistor 41 (42, 71, 72), i.e., about 1.1 Vtyp (=0.1+0.25+2+0.65).

Also, in the output circuit 3A' (3B') of FIGS. 2 and 3, the minimum operating voltage is determined by a saturation voltage such as 0.25 V of each of the transistors 31' and 33' (32' and 34') plus a peak-to-peak voltage such as 0.5 $V_{p-p}$ of the output voltage $V_{out}^+$ and $V_{out}^-$, i.e., about 1.0 Vtyp (=0.25×2+0.5).

Further, in the inverter circuit 4A (4B) of FIG. 2, the minimum operating voltage is determined by a saturation voltage such as 0.25V of the N-channel MOS transistor 41 (42) plus a gate-to-source voltage such as 0.65 V of the P-channel MOS transistor 33' (34'), i.e. , about 0.9 Vtyp (=0.25+0.65). On the other hand, in the local negative feedback circuit 7A (7B) of FIG. 3, the minimum operating voltage is determined by a saturation voltage such as 0.25V of each of the N-channel MOS transistors 71 and 73 (72 and 74) plus a gate-to-source voltage such as 0.65 V of the P-channel MOS transistor 33' (34'), i.e., about 1.15 Vtyp (=0.25×2+0.65).

Therefore, in the operational amplifier of FIG. 2, the minimum operating voltage is about 1.1 V, in this case, the nominal operating voltage will be 1.35 V in view of temperature characteristics and fluctuation, which is decreased by 0.45 V as compared with the operational amplifier of FIG. 1, thus decreasing the power consumption. Also, in the operational amplifier of FIG. 3, the minimum operating voltage is about 1.15 V, in this case, the nominal operating voltage will be 1.4

V in view of temperature characteristics and fluctuations, which is decreased by 0.4 V as compared with the operational amplifier of FIG. 1, thus decreasing the power consumption.

According to the inventor's simulation, in the operational amplifier of FIG. 3, a consumption current of 4.9 mA and a DC gain of 98 dB were obtained under the condition where $V_{DD}$ was 1.5 V, the unity gain frequency was 1.2 GHz and the load capacitance was 1.8 pF.

Figure 4:
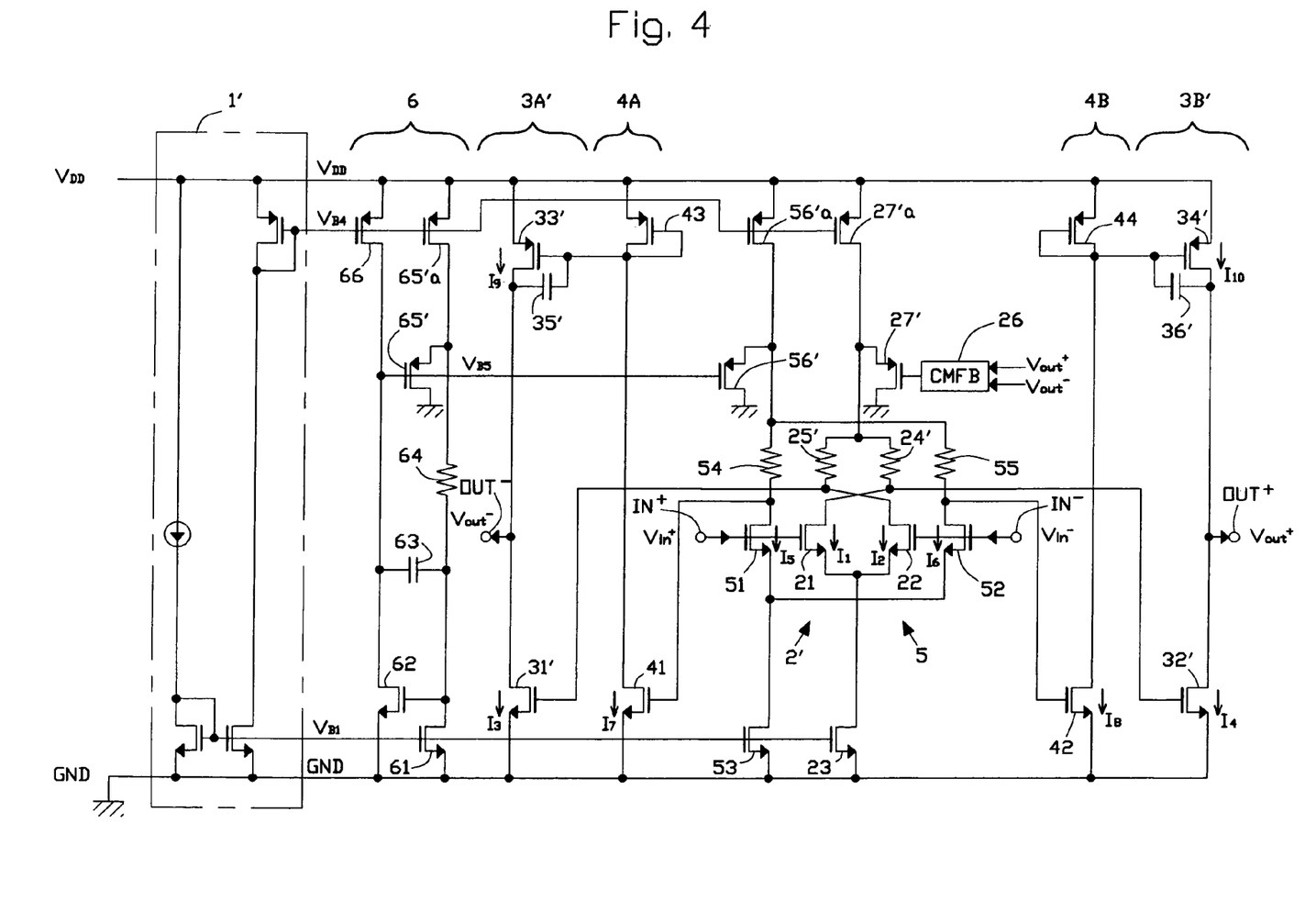
FIGS. 4 and 5 are circuit diagrams illustrating modifications of the operational amplifiers of FIGS. 2 and 3, respectively.
Figure 5:
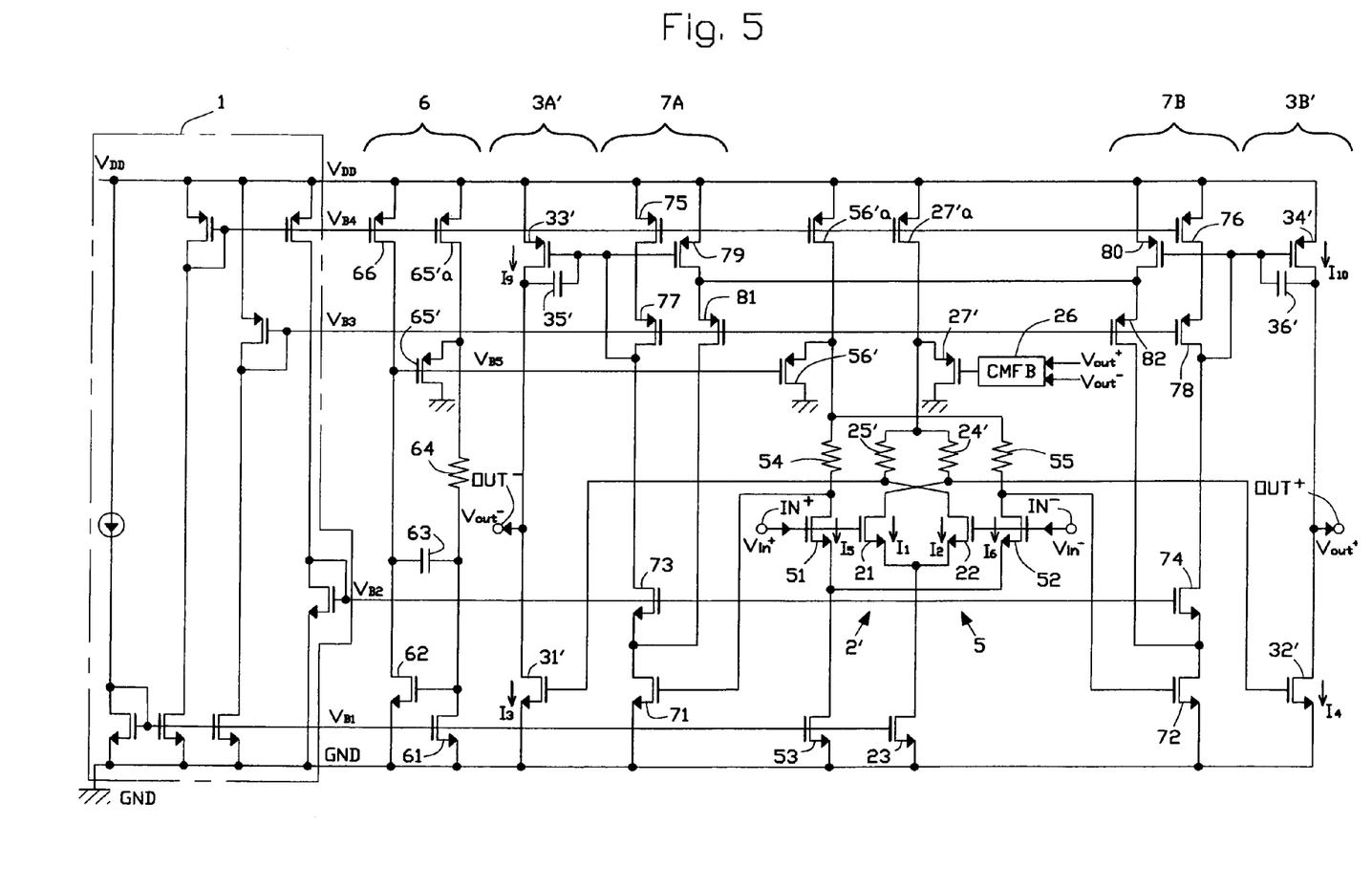

In FIGS. 2 and 3, the non-doped N-channel MOS transistors 27, 56 and 65 can be replaced by P-channel MOS transistors such as P-channel MOS transistors 27', 56' and 65' associated with P-channel MOS transistors 27'a, 56'a and 65'a serving as bias current sources as illustrated in FIGS. 4 and 5 which illustrate modifications of the operational amplifiers of FIGS. 2 and 3, respectively, although more currents would be required.

Also, in FIGS. 2 and 3, the ground terminal (GND) and the power supply terminal ($V_{DD}$) can be replaced with each other. In this case, the N-channel MOS transistors are replaced by P-channel MOS transistors, and the P-channel MOS transistors are replaced by N-channel MOS transistors.

As explained hereinabove, according to the present invention, a high DC gain wideband operational amplifier with a low operating voltage can be obtained.

The invention claimed is:

1. An operational amplifier, comprising:
    a first differential amplifier circuit formed by a pair of first N-channel MOS transistors associated with a first tail current source, a pair of first load resistors and a first source follower circuit connected to said first load resistors, said first differential amplifier circuit being adapted to amplify first and second input signals and to output first and second output signals;
    a second differential amplifier circuit formed by a pair of second N-channel MOS transistors associated with a second tail current source, a pair of second load resistors and a second source follower circuit connected to said second load resistors, said second differential amplifier circuit being adapted to amplify said first and second input signals and to output third and fourth output signals;
    a pair of inverter circuits adapted to further amplify said third and fourth output signals, respectively; and
    a pair of output circuits adapted to output differential output signals and supplied with first and second output signals and output signals of said inverter circuits.

2. The operational amplifier as set forth in claim 1, wherein a feed forward circuit realized by said differential amplifier circuit, said inverter circuits, and said output circuits has low DC gain wideband characteristics, and a gain circuit realized by said first differential amplifier and said output circuits has high DC gain narrowband characteristics.

3. The operational amplifier as set forth in claim 1, wherein each of said output circuits is supplied with one of said amplified first and second input signals by said first differential amplifier circuit and is connected to one of said inverter circuits which is supplied with the other of said amplified first and second input signals by said second differential amplifier circuit.

4. The operational amplifier as set forth in claim 1, wherein each of said inverter circuits includes a negative feedback circuit, each of said negative feedback circuits stabilizing a bias current flowing through an associated one of said first and second output circuits.

5. The operational amplifier as set forth in claim 1, further comprising a bias circuit generating a bias voltage,
    wherein said second source follower circuit includes a non-doped N-channel MOS transistor supplied with said bias voltage.

6. The operational amplifier as set forth in claim 1, wherein said first source follower circuit includes a first non-doped N-channel MOS transistor connected between a first power supply terminal and said first load resistors, and said second source follower circuit includes a second non-doped N-channel MOS transistor connected between said first power supply terminal and said second load resistors.

7. The operational amplifier as set forth in claim 1, wherein said first source follower circuit includes first and second P-channel MOS transistors connected in series between said first power supply terminal and said first load resistors, and said second source follower circuit includes a third and fourth P-channel MOS transistors connected in series between said second power supply terminal and said second load resistors.

8. The operational amplifier as set forth in claim 1, wherein each of said inverter circuits includes:
    a fifth MOS transistor having a source-drain path connected between a first node and a second power supply terminal and a gate supplied with one of said third and fourth output signals; and
    a sixth MOS transistor having a source-drain path connected between said first node and a first power supply terminal, said first node connected to one of said output circuits which is supplied with one of said first and second output signals, and a gate.

9. The operational amplifier as set forth in claim 8, wherein each of said inverter circuits further includes:
    a seventh MOS transistor having a source-drain path connected between said first node and said fifth MOS transistor;
    an eighth MOS transistor having a source-drain path connected between said first power supply terminal and said sixth MOS transistor;
    a ninth MOS transistor having a source-drain path connected between said first power supply terminal and a second node and a gate connected to said first node; and
    a tenth MOS transistor having a source-drain path connected between said fifth MOS transistor and said ninth MOS transistor,
    said second node of one of said inverter circuits being connected to said second node of the other of said inverter circuits.

10. The operational amplifier as set forth in claim 1, further comprising a common mode feedback circuit controlling said first source follower circuit so that a common mode voltage component between said differential output signals is brought close to a predetermined value.

* * * * *